United States Patent [19]
Gibbons

[11] Patent Number: 4,490,573
[45] Date of Patent: * Dec. 25, 1984

[54] SOLAR CELLS

[75] Inventor: James F. Gibbons, Palo Alto, Calif.

[73] Assignee: Sera Solar Corporation, Santa Clara, Calif.

[*] Notice: The portion of the term of this patent subsequent to May 26, 1998 has been disclaimed.

[21] Appl. No.: 265,430

[22] Filed: May 20, 1981

Related U.S. Application Data

[63] Continuation-in-part of Ser. No. 107,437, Dec. 26, 1979, Pat. No. 4,270,018.

[51] Int. Cl.³ .............................................. H01L 31/06
[52] U.S. Cl. .................................... 136/255; 136/258; 136/259; 136/261; 136/262; 136/265; 357/30

[58] Field of Search ......... 136/255, 258 PC, 258 AM, 136/261, 262, 265, 259; 357/30

[56] References Cited

U.S. PATENT DOCUMENTS 3,990,101 11/1976 Ettenberg ............................ 136/255
4,270,018 5/1981 Gibbons ............................... 136/258

Primary Examiner—Aaron Weisstuch
Attorney, Agent, or Firm—Flehr, Hohbach, Test, Albritton & Herbert

[57] ABSTRACT

A solar cell comprising layers of n-type and p-type crystalline or substantially crystalline semiconductor material separated by a layer of amorphous semiconductor material having a larger coefficient of absorption than the outer p-type and n-type layers.

14 Claims, 18 Drawing Figures

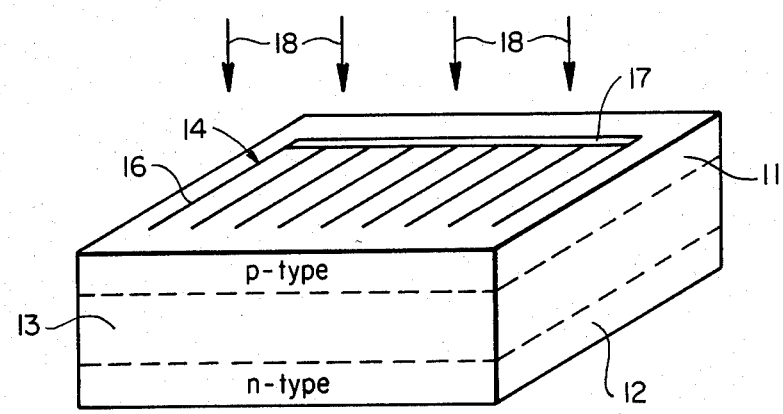
FIG_1
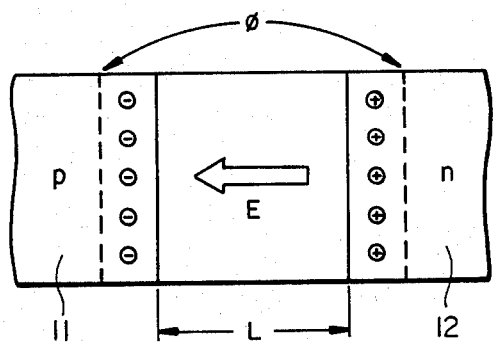
FIG_2
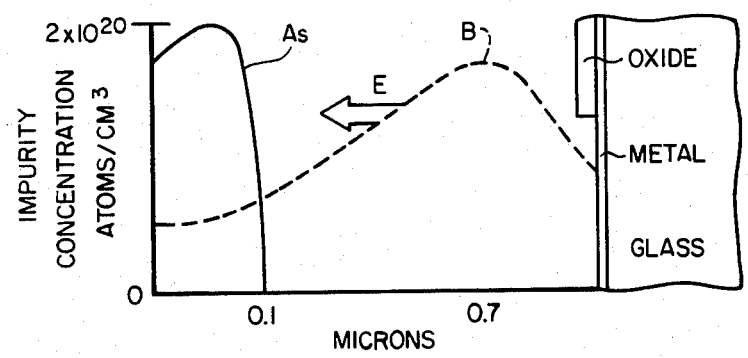
FIG_9

*FIG_3A*
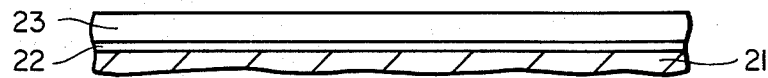
*FIG_3B*
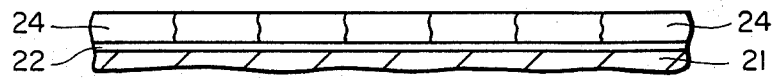
*FIG_3C*
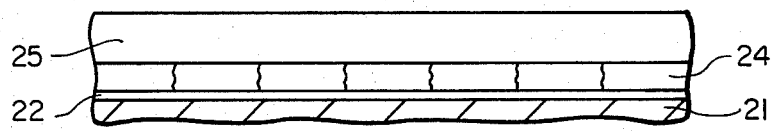
*FIG_3D*
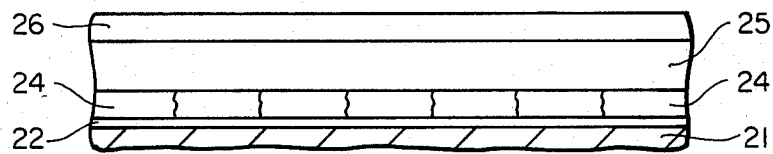
*FIG_3E*
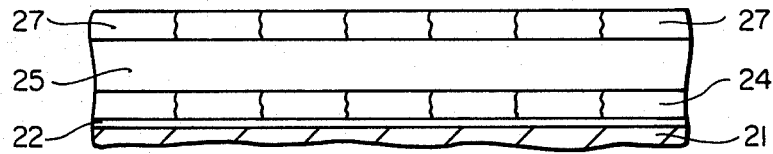
*FIG_3F*

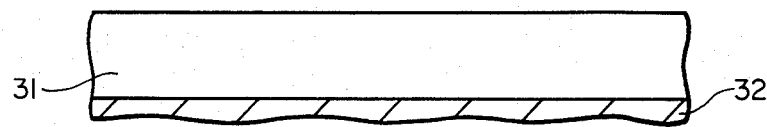
*FIG_4A*
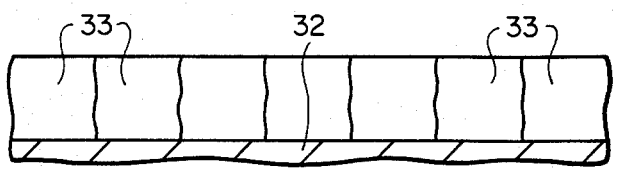
*FIG_4B*
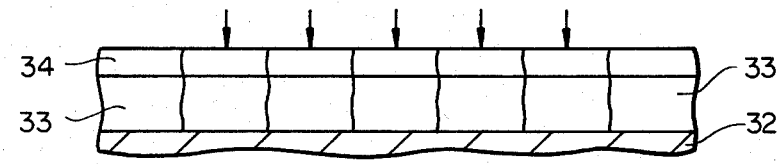
*FIG_4C*
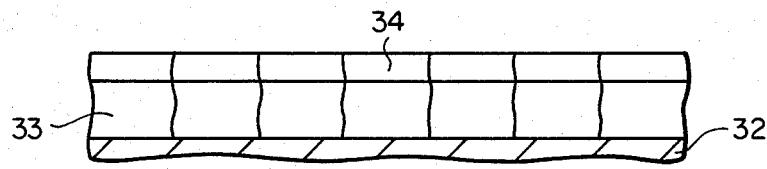
*FIG_4D*
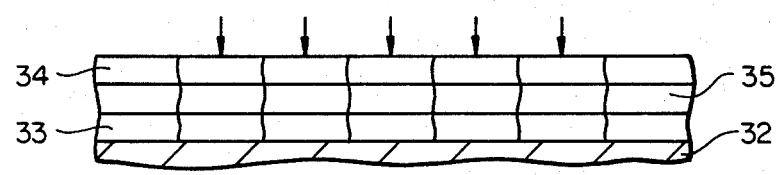
*FIG_4E*

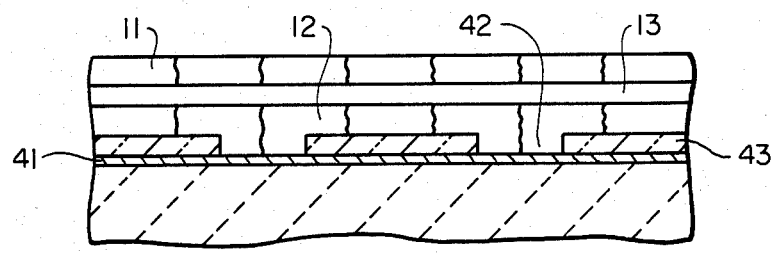
FIG_5
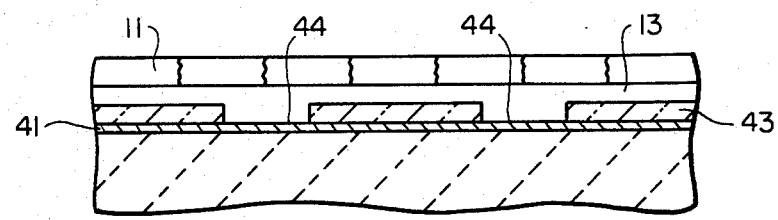
FIG_6
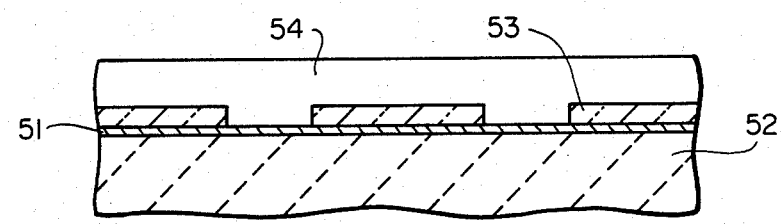
FIG_7
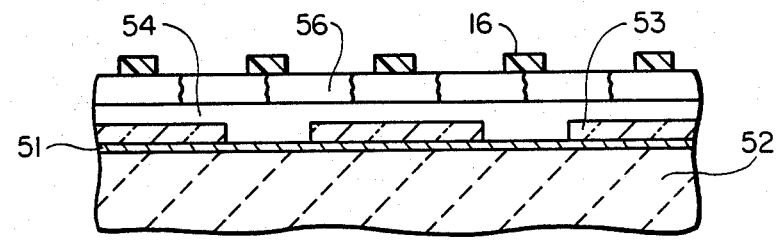
FIG_8

SOLAR CELLS

This application is a continuation-in-part of copending application, Ser. No. 107,437, filed Dec. 26, 1979, now U.S. Pat. No. 4,270,018.

This invention relates generally to solar cells made of semiconductor material and more particularly to such cells including amorphous semiconductor material.

For photons with energy near the band edge (hu~$E_g$), crystalline silicon is a relatively poor photon absorber because electronic transitions from the valence band to the conduction band are forbidden absent some form of disorder. While lattice vibrations result in some transitions, the photon absorption due to this effect proves to be relatively small, and therefore solar cells made from crystalline semiconductor material need to be relatively thick. However, disorder within the crystal permits electronic transitions to occur with relatively high probability and thus increases the optical absorption coefficient appreciably. In fact, substantial photon absorption is possible at photon energies well below $E_g$, given sufficient disorder.

The disorder that leads to increased absorption occurs in both truly amorphous semiconductor material and microcrystalline semiconductor material in which the grain size is on the order of a few hundred angstroms. Disorder that increases the optical absorption substantially can also be produced by ion-implantation in a single crystal. In what follows we use the term "amorphous" material to encompass all of these structures. Even though a particular material structure is described in the examples to follow, the operation is the same regardless of energy absorbing structure.

Because of its high absorbance both fully amorphous and microcrystalline materials are materials of great potential and interest for solar cell applications. This interest arises from the fact that fully amorphous or microcrystalline materials or mixtures thereof are highly efficient absorbers of solar energy and are at the same time extremely easy and cheap to prepare. For example, the optical absorption characteristics of silicon are such that a thin layer (~0.5 $\mu$m) of amorphous silicon will absorb as much solar energy as a 250 $\mu$m thick layer of crystalline silicon. Hence, the use of truly amorphous or microcrystalline semiconductor material or mixtures thereof as an optical absorber leads to the use of significantly less material than that required for a single crystal cell.

Amorphous semiconductor layers are also impressively inexpensive. They can be obtained by RF plasma deposition from a silane-based ($SiCl_4$) gaseous source or by either sputtering or evaporation of material from either powder or a charge of polycrystalline material, followed by an appropriate heating cycle. Microcrystalline semiconductor material can also be made by low pressure chemical vapor deposition techniques, and the degree of disorder can be increased if necessary by ion implantation. The RF deposition process is of special interest because it is simple to add dopants during the deposition process. Thus, p-type, n-type and intrinsic layers can be grown during one deposition run by appropriate control of the gases admitted to the plasma deposition chamber.

However, truly amorphous or microcrystalline cells made by any of the techniques described above are typically of very low efficiency. The reason for this is that the carrier lifetime in the amorphous layer is very short and, hence, the collection of electrons and holes from such a layer is difficult.

It is an object of the present invention to provide a solar cell including a collector layer of truly amorphous or microcrystalline semiconductor material having a high collection efficiency for holes and electrons generated in the layer and to a method of making the solar cell.

It is a further object of the present invention to provide a highly efficient, inexpensive solar cell and method of making the solar cell.

It is a further object of the present invention to provide a solar cell including a collecting layer of truly amorphous or microcrystalline semiconductor material or a mixture thereof in which the solar energy impinges on the solar cell, travels through the collecting layer and is then reflected back through the layer to increase the energy collecting efficiency.

These and other objects are achieved by a solar cell which includes n-type and p-type polycrystalline or crystalline layers separated by a truly amorphous or microcrystalline layer of semiconductor material or mixture thereof.

Other objects are achieved by a solar cell which includes n-type and p-type polycrystalline or microcrystalline semi-conductor layers separated by an amorphous layer of semi-conductor material or mixture thereof.

FIG. 1 is a perspective view of a solar cell in accordance with the present invention.

FIG. 2 is a partial sectional view showing the accelerating voltage across the amorphous semiconductive collector layer.

FIGS. 3A-F show the steps for one method of forming a solar cell in accordance with the present invention.

FIGS. 4A-E show the steps for another method of forming a solar cell in accordance with the present invention.

FIG. 5 shows a solar cell in accordance with the present invention having improved solar energy collecting capability.

FIG. 6 shows another solar cell in accordance with the present invention.

FIG. 7 shows an intermediate step in forming a solar cell in accordance with another embodiment of the invention.

FIG. 8 shows the completed solar cell of FIG. 7.

FIG. 9 shows the impurity concentration across the cell of FIG. 8.

Referring to FIG. 1, the solar cell comprises a first layer of crystalline or semicrystalline semiconductor material 11 spaced from a second layer of crystalline or semicrystalline semiconductor material 12 by a collecting layer 13 of amorphous or microcrystalline material. Layers 11 and 12 may, for example, be crystalline or polycrystalline semiconductor material. One of the layers is p-type and the other n-type. The amorphous layer may be an intrinsic layer. Suitable contacts 14 may be formed on the upper surface. The contacts may be in the form of a comb with relatively narrow and long teeth 16 and a wide back 17 whereby to provide for maximum penetration of solar energy into the cell, as shown by the rays 18. The layer 12 includes an ohmic contact whereby the electrical energy generated in the amorphous material between the p-type and n-type layers by carriers formed by the impinging solar energy can be recovered.

The collecting layer 13 serves as the optically active region in which the solar energy is absorbed and the carriers are generated. The absorption properties and thickness of the collecting layer are such that it will absorb substantially all of the solar energy that strikes the cell. Referring to FIG. 2, the contact potential that normally develops across a p-n or p-i-n junction is shown between the doped layers 11 and 12. For the purpose of this example, one assumes that the holes that leave the p-type region to form the space charge layer in the p-type material recombine with the electrons in the amorphous layer, namely the electrons coming from the n-type region. Thus, the amorphous layer is sandwiched between p-type and n-type semiconductive layers that are either single crystal or sufficiently large grain polycrystalline material to permit the development of space charge in the normal manner for a p-i-n junction. The two space charge layers shown in FIG. 2 produce an electric field in the intrinsic amorphous or microcrystalline layer whose value is $E = \phi/L$.

As an example, for silicon, $\phi = 0.7$ volts and if we use $L = 0.5$ μm, one obtains $E = 14,000$ volts/cm, a rather large field. With this field carriers that are generated in the amorphous layer can drift to the crystalline contact layers in a time $$v = L^2 \mu \phi$$

where μ is the carrier mobility. Taking the value of μ of 5 cm$^2$/V-sec as representative of typical carrier mobilities in an amorphous silicon film one finds the transit time across the conducting layer to be $$\tau = 0.7 \text{ ns}$$

Hence, a substantial fraction of the photogenerated carriers can be collected so long as the carrier lifetime is 1 ns or more. Without this electric field, however, the transit time would be governed by the carrier diffusion length for 1 ns lifetime which would be $$l_D \cong 0.14 \text{ μm}$$

Hence, carriers generated in most of the amorphous layer cannot be collected into the contact regions without the presence of the electric field. However, the electric field offers a technique so that most of the carriers generated in the collector region 13 are collected even when the carrier lifetime is so short that diffusion transport cannot possibly provide an efficient means for transporting carriers to the collecting layers. It is apparent that the better the transport properties, such as carrier mobility, the more efficient the carrier collection and more efficient the cell. The carrier mobility is believed to be somewhat improved with microcrystalline material for the layer 13.

Layers 11 and 12 are crystalline or semicrystalline layers of semiconductor material. The optical absorbing layer 13 may be the same or different semiconductor material. It is advantageous to have the energy gap of layer 13 less than that of layers 11 and 12 so that a larger open circuit voltage can be developed than would be the case if layer 13 had a larger energy gap than layers 11 and 12.

For example, the layers may be of the following combinations which are illustrative, and not exhaustive of the possible combinations:

| Layers 11 and 12 | Layer 13 |
| --- | --- |
| Si | $Si_x Ge_{1-x}$ |
| $Si_x C_{1-x}$ | $Si_y Ge_{1-y}$ |
| $Ga_x Al_{1-x} As$ | Ga As |
| Ga P | Ga As |
| SiC | $Zn_3 P_2$ |
| where x and y are percentages. | |

FIG. 3 illustrates the steps for one process for forming a solar cell in accordance with one embodiment of the present invention. The example will employ silicon for layers 11 and 12 and $Si_x Ge_{1-x}$ for layer 13. Starting with a graphite, silicon, quartz or other suitable substrate 21 it may be covered with a layer of $SiO_2$, $Si_3N_4$ or other material 22 which will not melt at the melting temperature of the other layers, FIG. 3A. Layer 22 could also be a conducting oxide such as $SnO_2$. This layer serves to prevent inadvertent doping from the substrate. An amorphous or microcrystalline layer 23 of material is grown on the substrate by plasma or chemical vapor deposition, FIG. 3B. The amorphous silicon may be doped with arsenic to form n-type material or may be doped by ion implantation. Thereafter, a continuous wave laser or electron beam can be scanned over the layer 23 to recrystallize the layer into large grain polycrystalline silicon illustrated schematically by the crystals 24, FIG. 3C. For example, the laser beam may be generated by a Spectra Physics Model 171 argon ion laser with power output of 15 watts focused onto a 40 micrometer spot scanned over the amorphous silicon layer at a speed of 10 centimeters per second. The layer will then have properties similar to those of single crystal material. If not previously doped the layer may be doped by standard diffusion techniques.

Next, the recrystallized n-type layer is used as a base on which a truly amorphous or microcrystalline layer 25 of an intrinsic silicon-germanium alloy can be deposited by plasma techniques. The amorphous layer may be 0.50 μm FIG. 3D. The microcrystalline layer may also be formed by low pressure chemical vapor deposition techniques to have optical properties similar to an amorphous silicon-germanium alloy and carrier mobilities in the range 5-25 cm$^2$/V-sec. Next a 0.25 μm layer 26 of silicon is deposited by plasma techniques, FIG. 3E. Layer 26 can be doped with boron during growth or by ion implantation afterward. Thereafter, a continuous wave laser operating at a power level of approximately 5 watts with other conditions as described above melts only the top 0.25 μm layer of the deposited silicon film. The laser beam recrystallizes the layer 26 containing the p-type dopant to form large grain crystals 27, FIG. 3F. The layer may also be doped by solid state diffusion or ion implantation and annealing after the laser recrystallization step.

In this way, n-type and p-type layers are formed with high quality large grain polycrystalline material with a layer of intrinsic truly amorphous or microcrystalline silicon-germanium separating the polycrystalline layers. Ohmic contacts can be made, for example, by forming comb-like contacts on the upper surface by masking and evaporation or sputtering and forming a lower contact layer by evaporation or sputtering.

An alternative method for fabricating a solar cell according to the present invention is described with reference to FIG. 4. Here a thin layer 31 of arsenic-doped amorphous silicon is deposited on a steel or graphite substrate 32, FIG. 4A. The material is then recrystallized by scanning with a laser beam as described above to produce large grain n-type crystallites 33, FIG. 4B. The recrystallization may also be carried out with an electron beam or other suitable means which produce crystals which extend between the two surfaces.

Next, a heavily doped p-type layer (p++) 34 is made directly in the n-type material by implanting boron, FIG. 4C, and using a CW laser or electron beam to anneal the implantation damage under conditions that produce substantially no diffusion of the implanted boron, FIG. 4D. By an appropriate choice of implantation conditions, the (p++ −n) junction can be formed at approximately 0.1 μm beneath the surface.

Next, flourine or other light ions are implanted at a dose and energy that will produce a buried amorphous layer 35, FIG. 4E. For example, implantation of flourine at a dose of $5 \times 10^{14} CM$ at an energy of 100 keV followed by a second flourine implantation at a dose of $5 \times 10^{14}/CM^2$ at an energy of 200 keV will succeed in amorphizing the polycrystalline silicon. The amorphous layer will start at approximately 0.1 μm and continue to a depth of approximately 0.4 μm. In this way we obtain p+ and n+ polycrystalline layers separated by an amorphous region as required in the present invention. Furthermore, by implanting flourine we introduce a species which tends to attach to silicon to reduce dangling bonds in the implantation-amorphized layer, thus improving the carrier lifetime in the amorphous layer.

As a third alternative, it would be possible to start with n-doped metallurgical grade crystalline or polycrystalline silicon substrate (wafers) obtained by casting, film growth (EFG) or conventional Czrocalski techniques. The steps outlined in FIG. 4C–E can then be performed to produce the p++ −n junction and the buried amorphous layer.

The transmit time of carriers can be reduced by making the amorphous layer 13 or 35 thinner. Referring to FIG. 5, there is shown a solar cell in which the solar absorbing layer 13 is thinner while having substantially the same solar absorbing characteristics. Before forming the cell in the manner above described, the substrate is provided with a thin highly reflective metal film 41 by suitable thin film techniques such as sputtering or evaporation.

The surface of the metal is coated with a patterned oxide coating. This coating can be formed by well known chemical vapor deposition techniques and then masked and etched to leave exposed areas 42 of the metal and oxide coated areas 43. The oxide coated areas protect the reflective film and maintain its reflecting properties. The exposed metal film areas serve as the back contact for the solar cell. The cell can then be formed to provide layers 11, 12 and 13 in the manner previously described. The oxide-coated metal reflects the solar energy so that it passes back through the amorphous layer 13, thus causing the solar energy to pass through the collecting layer two times. This permits thinner solar absorbing layers 13 and gives a factor of approximately four improvement in transit time.

By proper selection of the metal film it can form either a rectifying or ohmic contact 44, with the layer 13. If the metal forms a rectifying contact to p-type material, for example, then layer 12 can be eliminated. If the metal forms an ohmic contact to p-type material, then layer 13 can be lightly doped p-type and layer 11 is n-type, preferably heavily doped to reduce series resistance. Such a solar cell is shown in FIG. 6. The microcrystalline layer 13 may be p-type to form a low rectifying metal contact having junction 44. The top layer 11 may be highly doped, n+ to provide low series resistance.

FIGS. 7 and 8 show another method of fabricating a solar cell of the type shown in FIG. 6. The solar cell is formed by first depositing a reflective metal base 51 on a glass substrate 52. The surface of the metal is coated with an oxide layer, masked and etched as described above to provide oxide coated areas 53. The next step is to deposit an undoped layer of silicon 54 on the upper surface. The layer may be approximately one micron thick and formed by low pressure chemical vapor deposition techniques. The next step is to implant arsenic (As) at about 100 KV at a dose of $10^{15}/CM^2$ followed by a boron (B) implant at 300 KV at a dose of $10^{15}/CM^2$. This produces a doping as illustrated in FIG. 9. There is a doping gradient in the silicon layer which produces a field E. The implantation tends to drive the film amorphous or fine grain microcrystalline, improving its absorption properties. The upper surface of the arsenic layer is then crystallized to provide the upper layer 56 resulting in the device shown in FIG. 8.

There has been provided a solar cell which includes a center region which is highly absorbent to the solar energy to thereby generate carriers which are quickly removed by the built-in voltage between the n-type and p-type layers. Preferably the amorphous layer includes a gradient whereby to further enhance the collection of the generated carriers. By using a reflective back contact the collecting efficiency is increased.

The recrystallized p and n layers also offer substantially less resistance to current flow through the doped films to the comb contact fingers than amorphous layers. This leads to reduced power loss within the cell compared to a situation wherein no recrystallization has been performed.

What is claimed:

1. A solar cell comprising layers of n-type and p-type crystalline or substantially crystalline semiconductor material separated by a layer of amorphous semiconductor material having a larger coefficient of absorption than the outer p-type and n-type layers.

2. A solar cell as in claim 1 in which the outer layers have an energy gap greater than the separating layer.

3. A solar cell as in claim 1 in which the separating layer has a built-in impurity gradient to produce an electric field to aid in carrier transport.

4. A solar cell as in claim 1 in which the outer layers are heavily doped to form low resistivity layers to minimize loss of output power.

5. A solar cell as in claim 1 in which the separation layer is of a different composition than the outer layers.

6. A solar cell as in claim 1 in which the outer layers are silicon and the separation layer is silicon-germanium.

7. A solar cell as in claim 1 in which the outer layers are silicon-carbon and the separation layer is silicon-germanium.

8. A solar cell as in claim 1 in which the outer layers are $GA_xAl_{1-x}As$ and the separation layer is GaAs.

9. A solar cell as in claim 1 in which the outer layers are GaP and the separation layer is GaAs.

10. A solar cell as in claim 1 in which the outer layers are SiC and the separation layer is $Zn_3P_2$.

11. A solar cell as in claim 1 in which the separating layer is amorphized by ion implantation.

12. A solar cell including a substrate, a metal layer on said substrate, a patterned protective layer on said metal layer covering portions of said metal layer and exposing other portions, a crystalline or substantially crystalline layer of semiconductor material of one conductivity type on said metal layer and protective layer forming ohmic contact with said metal layer, a solar energy absorbing layer of amorphous semiconductor material on said layer of one conductivity type and a crystalline or substantially crystalline layer of semiconductor material of opposite conductivity type on said solar absorbing layer.

13. A solar cell as in claim 12 in which the solar energy absorbing layer has a built-in impurity gradient to produce an electric field to aid in carrier transport.

14. A solar cell as in claim 12 in which said metal layer is reflective.

* * * * *